United States Patent [19]

Lee

[11] Patent Number: 5,789,287
[45] Date of Patent: Aug. 4, 1998

[54] METHOD OF FORMING FIELD ISOLATION IN MANUFACTURING A SEMICONDUCTOR DEVICE

[75] Inventor: Chang Kwon Lee, Kyunggi-Do, Rep. of Korea

[73] Assignee: Hyundai Electronics Industries, Co., Ltd., Kyungki-Do, Rep. of Korea

[21] Appl. No.: 630,356

[22] Filed: Apr. 10, 1996

[30] Foreign Application Priority Data

Apr. 11, 1995 [KR] Rep. of Korea .............. 95-8341

[51] Int. Cl.⁶ .................................................. H01L 21/8238
[52] U.S. Cl. .................................................. 438/227; 438/451
[58] Field of Search .................................. 438/225, 227, 438/228, 449, 450, 451, 527, 529

[56] References Cited

U.S. PATENT DOCUMENTS

| | | | |
|---|---|---|---|
| 4,554,726 | 11/1985 | Hillenius et al. | 438/451 |
| 4,598,460 | 7/1986 | Owens et al. | 438/227 |
| 4,761,384 | 8/1988 | Neppl et al. | 438/228 |
| 4,839,301 | 6/1989 | Lee | 438/227 |
| 5,138,420 | 8/1992 | Komori et al. | 257/371 |
| 5,169,792 | 12/1992 | Katoh et al. | 257/398 |
| 5,563,091 | 10/1996 | Lee | 438/450 |

Primary Examiner—Chandra Chaudhari
Attorney, Agent, or Firm—Scott C. Harris, Esq.

[57] ABSTRACT

This invention discloses a method of manufacturing a semiconductor device, especially a method of forming field isolation, in which a portion of an active region around a field oxide film is highly-doped with the same type impurities as channel-stop impurity ions so that it changes a low-doped channel-stop region which results from a high temperature of field oxidation to a high-doped channel-stop region to prevent field inversion in device operation.

3 Claims, 4 Drawing Sheets

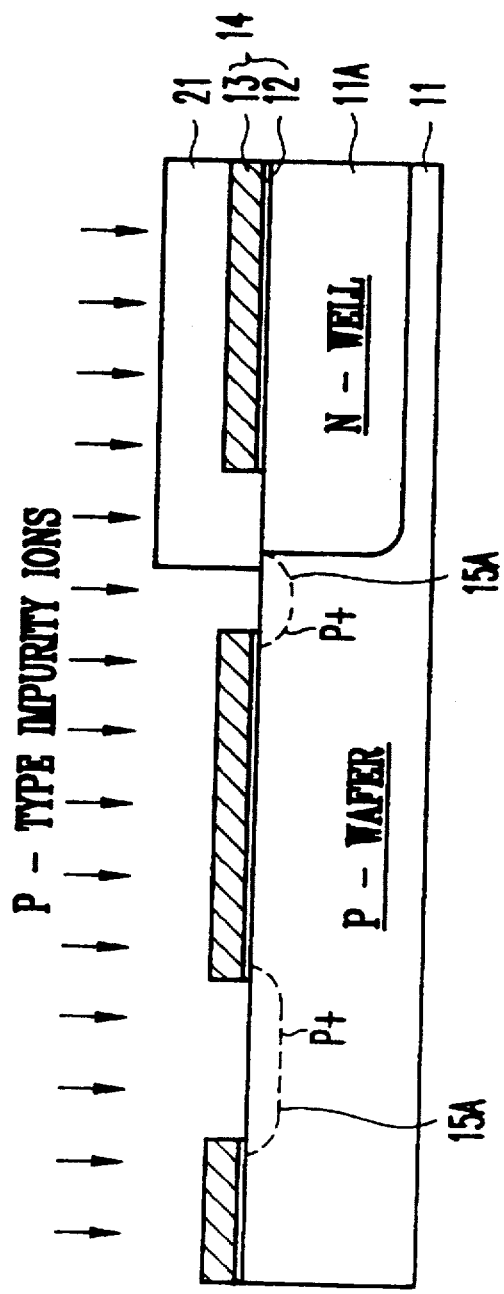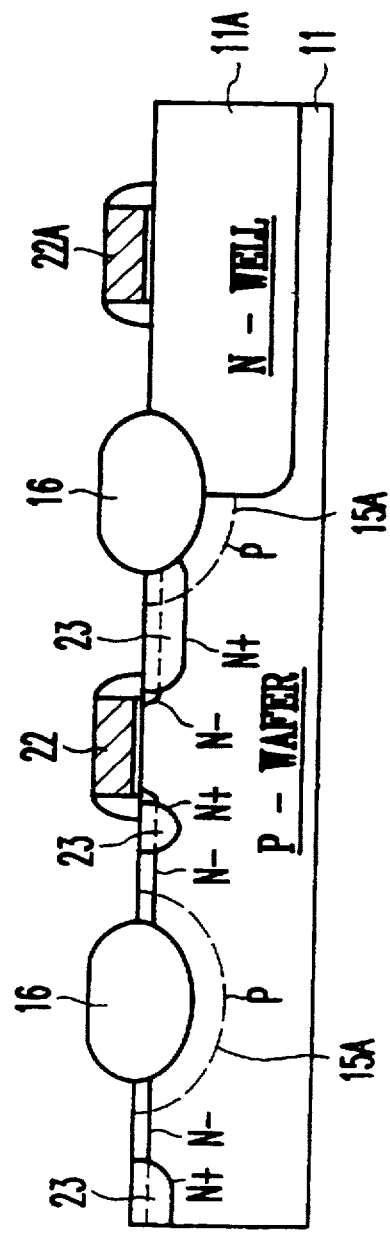

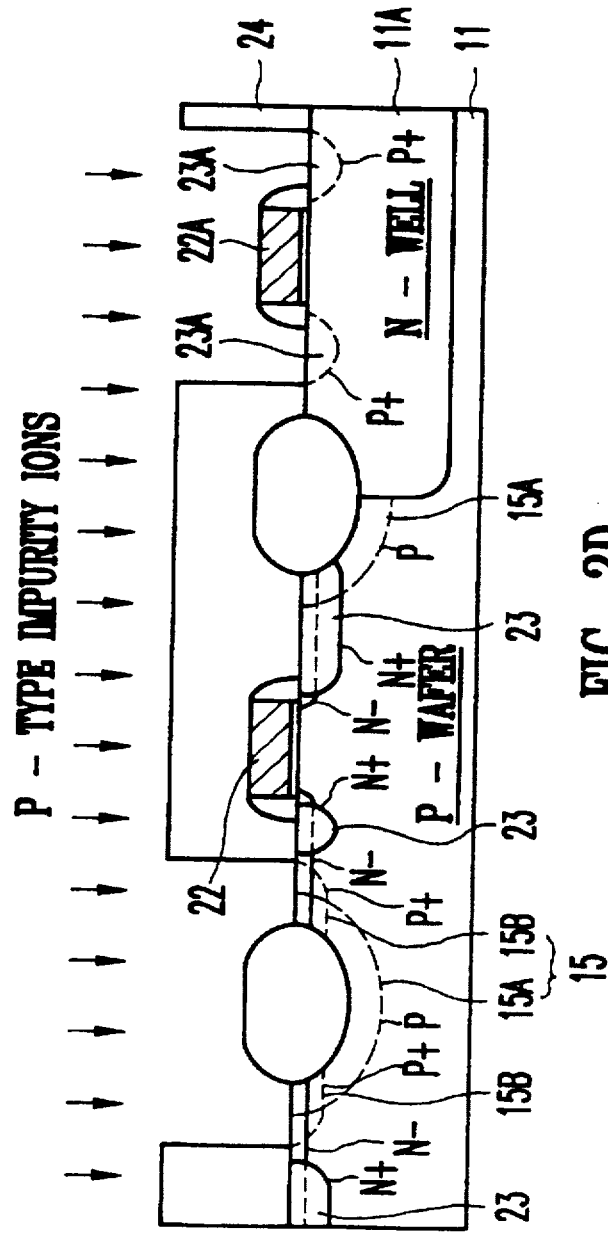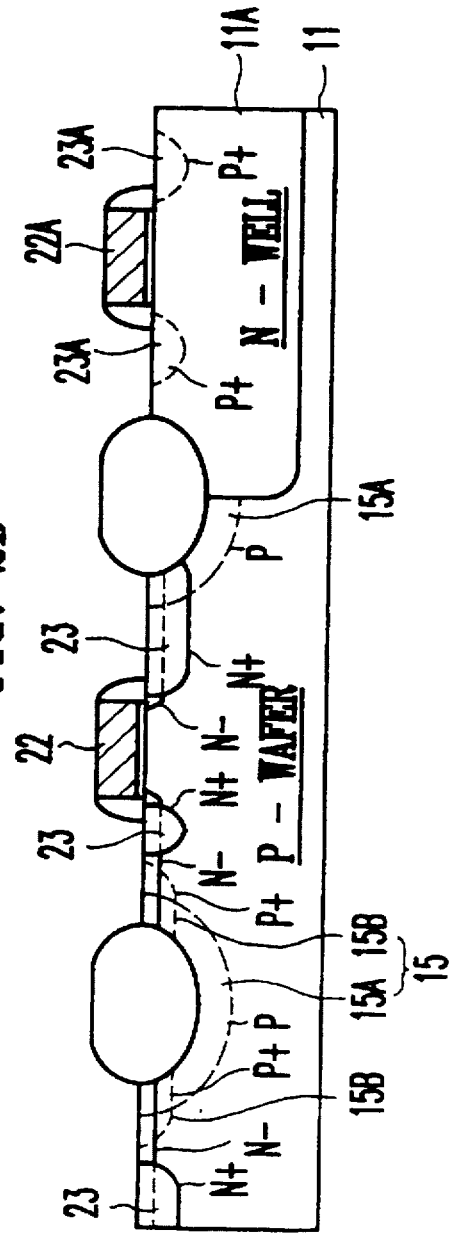

METHOD OF FORMING FIELD ISOLATION IN MANUFACTURING A SEMICONDUCTOR DEVICE

BACKGROUND OF THE INVENTION

1. Field of the Invention

This invention relates to a method of manufacturing a semiconductor device, and more particularly to a method of forming field isolation, by which channel formation caused by field inversion during device operation can be prevented.

2. Information Disclosure Statement

In an integrated circuit device, in order to isolate an active region electrically from other adjacent active regions, a channel-stop region is formed by an impurity ion injection process in a high concentration into a field region for channel-stop, and then followed by a high temperature oxidation process to form a field oxide film.

But channel-stop impurity ions are out-diffused during a thermal process like oxidation to form a field oxide film, whereby the channel-stop region becomes lightly-doped. Thus channel formation by field inversion in the channel-stop region happens during device operation. It means that a filed region residing between two adjacent active regions is easily turned on, thereby decreasing device reliability.

SUMMARY OF THE INVENTION

An object of the invention is that it provides a method of forming a field isolation of a semiconductor device to increase device reliability by solving a field inversion problem caused by concentration decreasing of impurity ions in a channel-stop region during process. To accomplish the object, the present invention, comprises the steps of: forming an oxidation resistant film having a pad oxide film and a nitride film on a wafer, etching a portion of the oxidation resistant film to form a field region, forming a channel-stop region by injecting channel-stop impurity ions in the field region, forming a field oxide film in the field region using a high temperature oxidation process, forming a photoresist pattern to open the field oxide film and a portion of the wafer around the field oxide film, implanting impurity ions in a high concentration in the above open regions of the wafer, thereby forming an impurity region connecting to the channel-stop region.

BRIEF DESCRIPTION OF THE DRAWINGS

For fuller understanding of the nature and objects of the invention, reference should be had to the following detailed description taken in conjunction with the accompanying drawings in which:

FIGS. 2A through 2D are cross-sectional views of a semiconductor device in order to show a method of forming field isolation in accordance with a second embodiment of the present invention.

Similar reference characters refer to similar parts through the several views of the drawings.

DETAILED DESCRIPTION OF THE INVENTION

FIGS. 1A through 1E are cross-sectional views of a semiconductor device to illustrate the procedures of forming field isolation at successive steps in accordance with a first embodiment of the present invention.

Figure 1A:
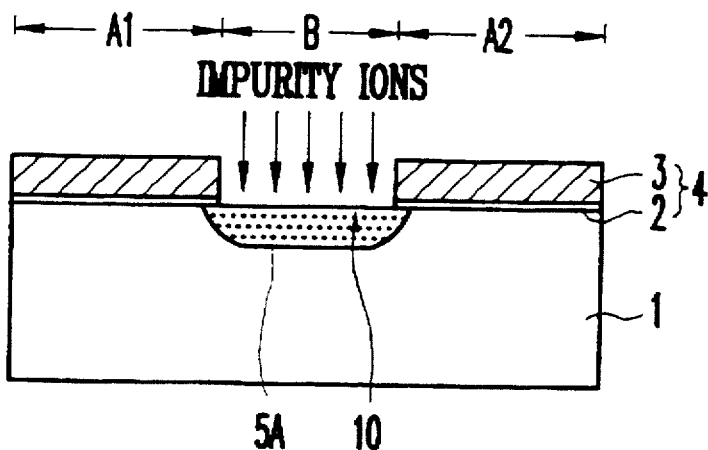
FIGS. 1A through 1E are cross-sectional views of a semiconductor device for explaining a method of forming field isolation according to a first embodiment of the present invention.

In FIG. 1A, an oxidation resistant film(4) comprising a pad oxide film(2) and a nitride film(3) is formed on a wafer(1). And the nitride film(3) and the pad oxide film(2) of a field region(B) are sequentially etched by a lithography and etch process using a device isolation mask. Therefore, the oxidation resistant film(4) remains in active regions(A1 and A2) and they prevent the active regions(A1 and A2) from oxidizing in an oxidation process to grow a field oxide film. A channel-stop region(5A) is formed in the wafer(1) of the field region(B) by injecting channel-stop impurity ions (10) in a high concentration in the field region. If the wafer(1) is p⁻ typed, the channel-stop region(5A) is formed by injecting p⁺ type impurity ions(for example, B or $BF_2$) in a high concentration as channel-stop impurity ions(10), on the contrary if the wafer(1) is n-typed, the channel-stop region (5A) is formed by injecting n⁺ type impurity ions(for example; P, As, or Sb) in a high concentration as channel-stop impurity ions(10).

The channel-stop region(5A) formed by injecting impurity ions in a high concentration has a high potential barrier in device operation so that it can prevents field inversion in the wafer(1) under the field oxide film.

Figure 1B:
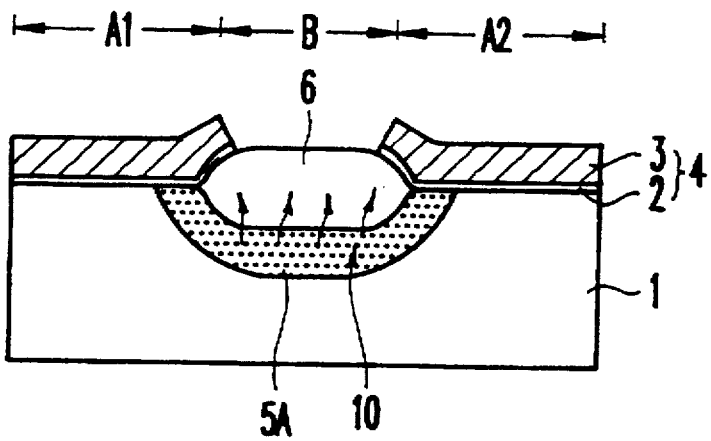
Figure 1C:
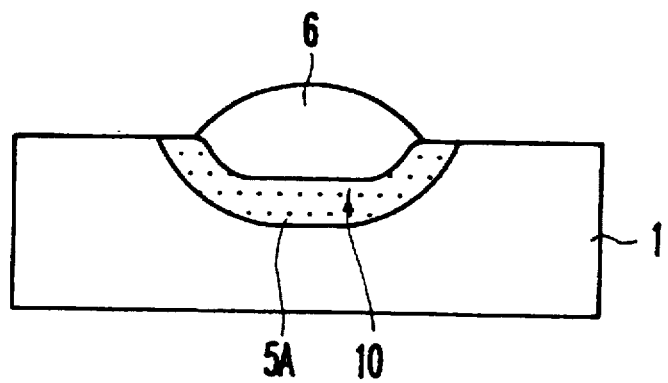

In FIG. 1B, a field oxide film(6) is formed in the wafer (1) of the field region(B) using a high temperature oxidation process. The high temperature oxidation process to grow the field oxide film(6) is performed in the temperature range of 850° C. through 1200° C. for long time. During the growth of the field oxide film(6), the channel-stop impurity ions(10) in the channel-stop region(5A) are out-diffused so that the channel-stop region(5A) of high concentration becomes a channel-stop region(5A) of low concentration as shown in FIG. 1C. The oxidation resistant film(4) is removed after the formation of the field oxide film(6).

Based on the above described, to make much sure of isolating one active region(A1) electrically from the other active region(A2), the channel-stop region(5A) is formed by injecting channel-stop impurity ions(10) in a high concentration. But because the channel-stop region(5A) which turns lightly-doped due to a high temperature process like oxidation has a low potential barrier during device operation, field inversion easily happens to form a channel. So the field region(B) between the active region(A1) and the other active region(A2) is easily turned on, thereby decreasing the reliability of the device. Solutions to fix these problems are described here.

Figure 1D:
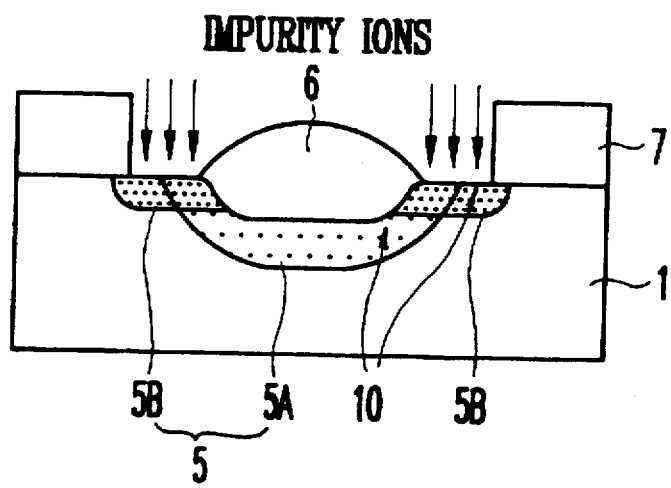

Referring FIG. 1D, photoresist patterns((7) to open the field oxide film(6) and a portion of the wafer(1) around the field oxide film(6) are formed by a photolithography process using a field-inverted mask(not shown). Impurity ions in a high concentration of the same type ion as the channel-stop impurity ion(10) are then implanted in the above opened regions of the wafer, thereby forming an impurity region (5B) connecting to the channel-stop region(5A).

As the channel region(5B) is highly-doped, it has a high potential barrier in device operation.

Figure 1E:
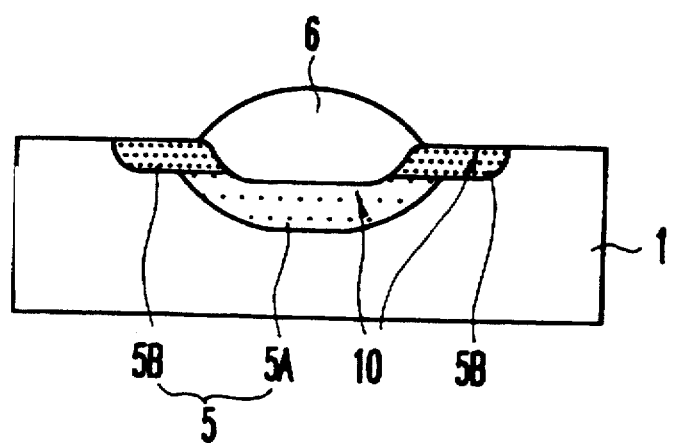

FIG. 1E illustrates that the channel-stop region(5) of the present invention is accomplished after removing the photoresist patterns(7). The channel-stop region(5) of the present invention comprises two regions: the lightly-doped channel-stop region(5A) with a low potential barrier under the field oxide film(6), and the impurity region(5B) connecting to the channel-stop region(5A) at both side ends of the field oxide film(6).

According to the first embodiment of the present invention, forming the impurity region(5B) with a high potential barrier at both side ends of the lightly-doped channel-stop region(5A) with a low potential barrier prevents field inversion of the problem of the prior art so that reliability of the device can be improved.

The above principle of the present invention is applicable to manufacturing methods of all kinds of semiconductor devices, especially to a CMOS device with n-well, a CMOS device with p-well, and a twin well CMOS device. A CMOS device with n-well will be explained as an example.

FIGS. 2A through 2D are cross-sectional views of a CMOS device with n-well in order to show a method of forming field isolation in accordance with a second embodiment of the present invention.

In FIG. 2A, an n-well(11A) is formed by injecting n-type impurity ions in a portion of a p-type wafer(11). And an oxidation resistant film(14) comprising a pad oxide film(12) and a nitride film(13) is formed on the wafer(11). And a portion of the nitride film(13) and the pad oxide film(12) are sequentially etched by a lithography and etch process using a device isolation mask whereby the wafer(11) in a field region is exposed. To form a channel-stop region(15A) in the p-type wafer(11), a first photoresist pattern(21) is formed over the n-well(11A). And the channel-stop region(15A) is formed by implanting $p^+$ channel-stop impurity ions in a high concentration using the first photoresist mask pattern (21) and the oxidation resistant film(14) as a mask.

Referring FIG. 2B, after removing the first photoresist mask(21), a field oxide film(16) is formed in a field region through an oxidation process. At this time, channel-stop impurity ions of the channel-stop region(15A) are out-diffused so that the channel-stop region(15A) becomes lightly-doped. Problems related to this process are well explained in FIG. 1C of the first embodiment of the present invention. On an active region of the p-type wafer(11), an NMOS transistor is formed. The NMOS transistor has a gate electrode(22), and source and drain electrodes formed by injecting $n^-$ and $n^+$ impurity ions. When a gate electrode(22) of the NMOS transistor is formed, a gate electrode(22A) of a PMOS transistor is formed at the same time.

FIG. 3C illustrates that $p^+$ source/drain impurity ions are injected to form source and drain electrodes(23A) of the PMOS transistor. At this time, a second photoresist pattern (24) used as a mask for injecting $p^+$ source/drain impurity ions has opening area not only in the field oxide film(16) but also in a portion of the p-type wafer(11) around the field oxide film(16). So the above opened area of the $p^-$ type wafer is implanted with $p^+$ impurity ions for $p^+$ source/drain electrodes(23A) so that it becomes an impurity region(15B).

The impurity region(15B) has $p^+$ impurity ions of high concentration, so it has a high potential barrier in device operation.

Accomplishing the channel-stop region(15) of the present invention after removing the second photoresist pattern(24) is shown in FIG. 2D.

The channel-stop region(15) according to the second embodiment of the present invention comprises two regions; the lightly-doped channel-stop region(15A) with a low potential barrier under the field oxide film(16), and the impurity region(15B) connecting to the channel-stop region (15A) at both side ends of the field oxide film(16).

According to the second embodiment of the present invention, forming an impurity region(15B) with a high potential barrier at both side ends of the lightly-doped channel-stop region(15A) by the same process as implanting $p^+$ source/drain impurity ions makes it possible to prevent the field inversion of the problem of the prior art and to increase the yield of the device.

The foregoing description, although described in its preferred embodiment with a certain degree of particularity, is only illustration of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of fabricating a CMOS transistor, comprising the steps of:

forming an n-well by injecting n-type impurity ions in a portion of a p-type wafer;

forming an oxidation resistant film on said wafer;

etching a portion of said oxidation resistant film to form a field region;

injecting channel-stop impurity ions in said field region of said p-type wafer excepting said n-well, thereby forming a channel-stop region;

forming a field oxide film in said field region;

removing said oxidation resistant film;

forming a first and a second gate electrode on said p-type wafer and n-well, respectively;

forming a first source and a first drain electrode in said p-type wafer; and simultaneously forming an impurity region at both side ends of said field oxide film and a second source electrode and a second drain electrode in said n-well.

2. The method of claim 1, wherein impurity ions for said channel-stop region and said impurity region are p-type impurities.

3. The method of claim 2, wherein said p-type impurity ions are any one of B and $BF_2$.

* * * * *